(12) United States Patent
Rub et al.

(10) Patent No.: US 11,372,765 B2
(45) Date of Patent: *Jun. 28, 2022

(54) MAPPING FOR MULTI-STATE PROGRAMMING OF MEMORY DEVICES

(71) Applicant: Western Digital Technologies, Inc., San Jose, CA (US)

(72) Inventors: Bernie Rub, Sudbury, MA (US); Mostafa El Gamal, Worcester, MA (US); Niranjay Ravindran, Rochester, MN (US); Richard David Barndt, San Diego, CA (US); Henry Chin, Fremont, CA (US); Ravi J. Kumar, Redwood City, CA (US); James Fitzpatrick, Laguna Niguel, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 47 days.

This patent is subject to a terminal disclaimer.

(21) Appl. No.: 16/905,789

(22) Filed: Jun. 18, 2020

(65) Prior Publication Data
US 2020/0320009 A1    Oct. 8, 2020

Related U.S. Application Data

(63) Continuation of application No. 16/221,378, filed on Dec. 14, 2018, now Pat. No. 10,705,966.

(51) Int. Cl.
*G06F 12/0873* (2016.01)
*G06F 12/02* (2006.01)
(Continued)

(52) U.S. Cl.
CPC ...... *G06F 12/0873* (2013.01); *G06F 11/1068* (2013.01); *G06F 12/0246* (2013.01);
(Continued)

(58) Field of Classification Search
CPC ............ G06F 11/1012; G06F 11/1068; G06F 12/0246; G06F 12/0871; G06F 12/0873;
(Continued)

(56) References Cited

U.S. PATENT DOCUMENTS 8,885,410 B2    11/2014  Marcu et al.
9,400,713 B2     7/2016  Gorobets
(Continued)

*Primary Examiner* — Zhuo H Li
(74) *Attorney, Agent, or Firm* — Morgan, Lewis & Bockius LLP

(57) ABSTRACT

Storage device programming methods, systems and devices are described. A method may generate a mapping of data based on a set of data, the mapping of data including a first mapped data and a second mapped data. The method may include performing a first programming operation to write, in a first mode, the first mapped data to the memory device. The method may include storing the second mapped data to a cache. The method may include generating a second set of data, based on an inverse mapping of the mapping of data including the second mapped data from the cache and the first mapped data from the memory device, for writing, in a second mode, to the memory device, wherein the second set of data includes the set of data, and the first mode and the second mode correspond to different modes of writing to the memory device.

20 Claims, 6 Drawing Sheets

(51) Int. Cl.
  *G06F 11/10*     (2006.01)
  *G11C 11/56*     (2006.01)
  *G11C 8/10*      (2006.01)
(52) U.S. Cl.
  CPC ............ *G11C 8/10* (2013.01); *G11C 11/5628*
        (2013.01); *G06F 2212/283* (2013.01); *G06F
               2212/403* (2013.01); *G06F 2212/608*
              (2013.01); *G11C 2211/5641* (2013.01)
(58) Field of Classification Search
  CPC ..... G06F 2212/1024; G06F 2212/1032; G06F
                      2212/214; G06F 2212/283; G06F
                      2212/313; G06F 2212/403; G06F
                      2212/608; G06F 2212/7203; G06F
              2212/7208; G11C 11/5628; G11C 16/10;
                G11C 2211/5641; G11C 7/1006; G11C
                                                 8/10
  See application file for complete search history.

(56)           References Cited

U.S. PATENT DOCUMENTS 10,705,966 B1 *   7/2020  Rub ................... G06F 12/0871
2017/0192902 A1    7/2017  Hwang
2017/0287568 A1   10/2017  Yang
2018/0314448 A1   11/2018  Grossman
2020/0090759 A1    3/2020  Sharma

* cited by examiner

MAPPING FOR MULTI-STATE PROGRAMMING OF MEMORY DEVICES

CROSS-REFERENCE TO RELATED APPLICATION

This application is a continuation of application Ser. No. 16/221,378, filed on Dec. 14, 2018, now U.S. Pat. No. 10,705,966, the entirety of each of which is incorporated herein by reference for all purposes.

BACKGROUND

The subject application relates generally to data storage systems, devices and methods. More specifically, the subject application relates to, for example, without limitation, multi-state programming for writing data to memory devices.

The description provided in the background section should not be assumed to be prior art merely because it is mentioned in or associated with the background section. The background section may include information that describes one or more aspects of the subject technology, and the description in this section does not limit the invention.

BRIEF DESCRIPTION OF THE DRAWINGS

A detailed description will be made with reference to the accompanying drawings.

DETAILED DESCRIPTION

Figure 1:
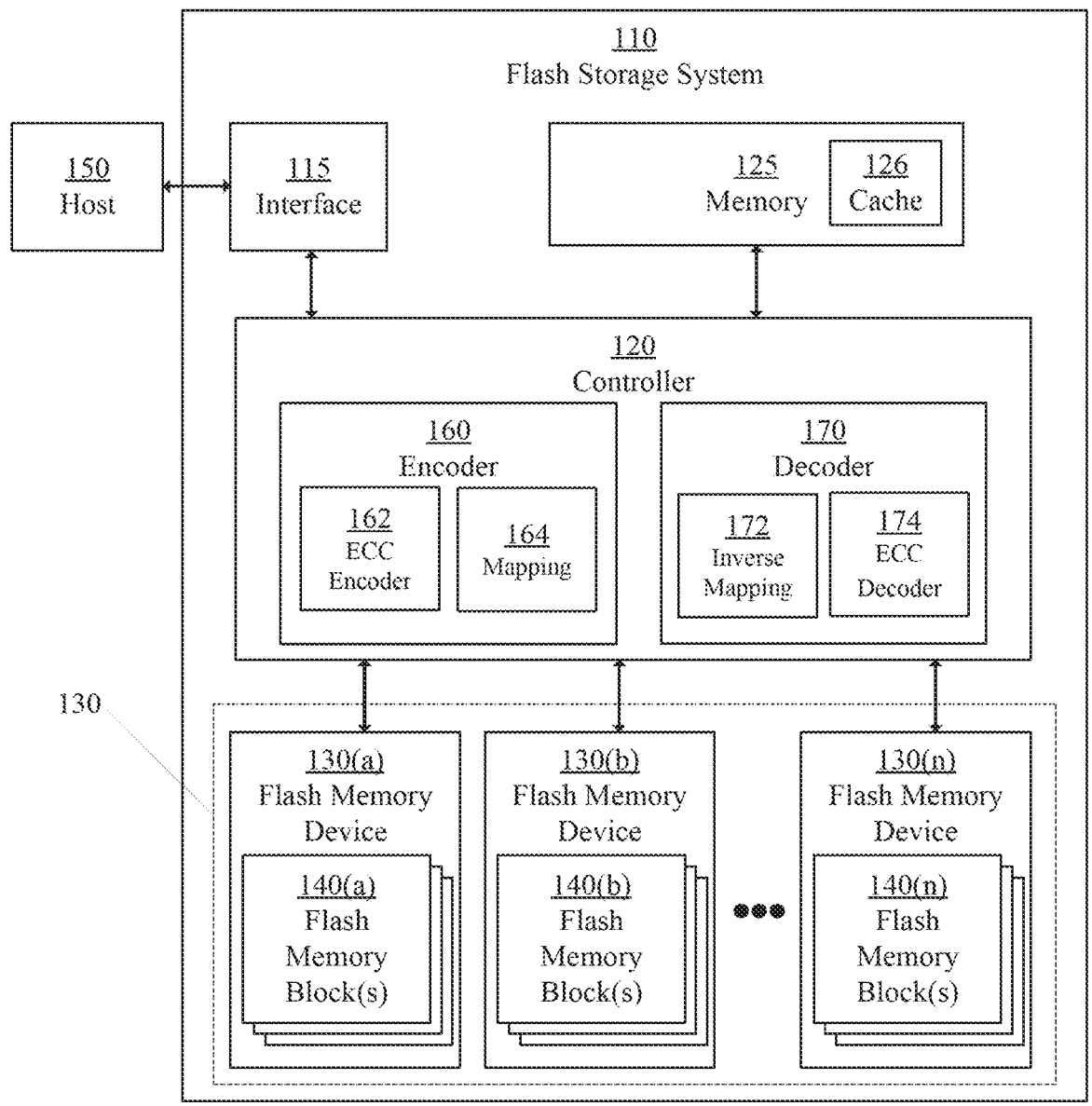
FIG. 1 is a block diagram illustrating components of a flash storage system according to aspects of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

Some flash memory and other solid-state storage devices may implement multi-level cell (MLC) memory, triple-level cell (TLC) memory, quadruple-level cell (QLC) memory, or the like to store multiple bits of data in the same memory cell. Generally, MLC, TLC and/or QLC memory cells are programmable to multiple states, which are each characterized by separate voltage thresholds. For example, a two-bit MLC memory cell can be programmed to one of four different states, a three-bit TLC memory cell can be programmed to one of eight different states, or a four-bit QLC memory cell can be programmed to one of sixteen different states, with each state corresponding to a unique voltage range. MLC, TLC, and QLC memory may have different write times, read times, programming requirements, reliability, error rates, or the like.

In one or more examples, foggy and fine programming techniques for multi-bit per cell NAND flash memory may refer to a two stage or multi-state programming technique (e.g., "foggy/fine programming") where NAND cell voltages are quickly brought close to desired voltage levels (e.g., as determined by the bit pattern stored in each cell) in a first wordline programming operation (e.g., foggy programming operation), then programmed to their final voltage levels in a second programming operation where the program step size is much smaller (e.g., fine programming operation).

Quadruple-level cell (QLC) technology requires a very precise programming process to place sixteen distributions in a small voltage range (~6.2 v), with a QLC state width of ~0.4 v. In an example, two programming passes are used, namely, the aforementioned foggy and fine programming passes. A drawback of this approach is that the foggy programming pass is unreadable, and hence, four pages of host data need to be cached until the fine pass is finished. The data caching reduces the drive capacity available to the host and system management algorithms. Therefore, finding an alternative to foggy fine programming that requires less caching can reduce the drive cost per gigabyte, or allow for more over-provisioning that increases the drive endurance. In one or more implementations described herein, the subject technology advantageously reduces the data buffering requirements in the controller, which improves the functionality of a given computing device.

In one or more implementations, programming of a memory may be carried out in multiple passes (e.g., two passes). For example, programming can be performed in a TLC mode, using mapping techniques described herein, then be extended to a QLC mode, using inverse mapping techniques described herein. In one or more implementations, the mapping from TLC to QLC is critical as this mapping affects the programming speed, and whether the bit error rate (BER) and read latency are balanced across the four QLC pages (when assuming no vertical coding).

In an example, a mapping involves programming standard TLC in a first programming pass, then splitting each TLC state to two adjacent QLC states in a second programming pass. This mapping achieves the highest program speed (e.g., wide TLC states), the lowest program disturb (low voltage change in the second program pass), but can result in an unbalanced QLC Gray code (e.g., 2328), and hence, the read latency and BER varies across the four pages (lower, middle, upper, and top). The page with eight read levels may have the highest BER and read latency.

As referred to herein, a Gray code is an encoding of information in which for a defined sequence, only a single bit changes state with each step through the sequence. A conventional binary counter does not have this property since for example, the four-bit encoding for the number three is 0011 and the four-bit encoding for the number four is 0100. In this example, transitioning from 0011 to 0100 requires changing three bits, namely the three least significant bits, from 1 to 0 or 0 to 1. An example of a four-bit Gray code is shown in the Table 1 below.

TABLE 1

| State | Pattern |
|---|---|
| 0 | 0000 |
| 1 | 0001 |
| 2 | 0011 |
| 3 | 0111 |
| 4 | 1110 |
| 5 | 1100 |
| 6 | 1000 |
| 7 | 1000 |

Note that in Table 1, a single bit changes state in all cases of stepping from one state to the next in the defined sequence. For a given number of bits, it is understood that there can be multiple encoding schemes that constitute Gray codes.

One or more implementations of the subject technology provide various advantages over other methods (e.g., foggy/fine programming), including, without limitation: 1) significantly reducing the size of program caching (only 25% of the size required by foggy/fine programming), which can reduce the drive cost per gigabytes (GB), or allow for more over provisioning that increases the drive endurance, 2) achieving high programming speed, and 3) balancing the BER and read latency across all pages.

One or more implementations of the subject technology provide several performance benefits that improve the functionality of a computer (e.g., computing device). For example, the subject technology enables multi-state programming techniques to be utilized without a large increase in memory requirements for the controller. As a result, it is appreciated that implementations of the subject technology improve the functionality of a computing device, including a flash storage system as described herein, by at least reducing memory requirements which can also improve processing burdens of such a computing device. Further, latency in writing data, when using the multi-state programming techniques described herein, to a flash memory device may be improved, which further improves the functionality of such a computing device. In addition, the implementations described herein may improve decoding latency and reduce decoding complexity of data when using multi-state programming thereby improving the performance of the computing device.

FIG. 1 is a block diagram illustrating components of a flash storage system 110 according to aspects of the subject technology. As depicted in FIG. 1, the flash storage system 110 includes an interface 115, a controller 120, a memory 125, a cache 126, an encoder 160, an ECC encoder 162, a mapping component 164, a decoder 170, an inverse mapping component 172, an ECC decoder 174, and flash memory devices 130. The interface 115 facilitates communication of data, commands, and/or control signals between the flash storage system 110 and a host 150. The controller 120 controls the operation of the flash storage system 110 to store and retrieve data in the flash memory devices 130 (e.g., illustrated as flash memory device 130(*a*), 130(*b*) to 130(*n*) to depict at least several devices) in accordance with commands received from the host 150. The controller 120 may include a single core processor or a multi-core processor which includes several separate computing cores for executing instructions. For example, the computing cores in the multi-core implementation can run respective instructions in parallel including portions of the firmware of the flash storage system 110. The memory 125, which may be a random access memory (RAM), provides temporary storage space for the controller 120 to process commands and transfer data between the host 150 and the flash memory devices 130.

The decoder 170, which may include memory, registers, one or more processors, a system-on-a-chip (SoC), an application specific integrated circuit (ASIC), a field programmable gate array (FPGA) or other programmable logic device, discrete gate or transistor logic device, discrete hardware components, or any combination thereof, and may be integrated with or separate from the controller 120, decodes data using various decoding schemes. The memory 125 may include the cache 126. Alternatively, the cache 126 may be implemented separately from the memory 125 as a separate volatile memory (e.g., random access memory), which could be faster memory than the memory 125. In another example, the cache 126 may also be included with one or more of the flash memory devices 130. The encoder 160, which may include memory, registers, one or more processors, a system-on-a-chip (SoC), an application specific integrated circuit (ASIC), a field programmable gate array (FPGA) or other programmable logic device, discrete gate or transistor logic device, discrete hardware components, or any combination thereof, and may be integrated with or separate from the controller 120, encodes data to be written to the flash memory device 130 using various encoding schemes. The operation of each of these components is described in more detail below.

The interface 115 provides physical and electrical connections between the host 150 and the flash storage system 110. The interface 115 is configured to facilitate communication of data, commands, and/or control signals between the host 150 and the flash storage system 110 via the physical and electrical connections. The connection and the communications with the interface 115 may be based on a standard interface such as Universal Serial Bus (USB), Small Computer System Interface (SCSI), Serial Advanced Technology Attachment (SATA), Mini-SATA (mSATA), PCIe, etc. Alternatively, the connection and/or communications may be based on a proprietary interface, although the subject technology is not limited to any particular type of interface.

The host 150 may be a computing device, such as a computer/server, a smartphone, or any other electronic device that reads data from and writes data to the flash storage system 110. The host 150 may have an operating system or other software that issues read and write commands to the flash storage system 110. The flash storage system 110 may be integrated with the host 150 or may be external to the host 150. The flash storage system 110 may be wirelessly connected to the host 150, or may be physically connected to the host 150.

The controller 120 may also include an internal management processor, which may run on one of the cores of the controller 120 in a multi-core implementation. The internal management processor may use the interface 115 to communicate with other components illustrated in FIG. 1, including the host 150, the memory 125, the controller 120, and the flash memory devices 130.

FIG. 1 shows multiple flash memory devices 130. The flash storage system 110 may include one or more flash memory devices 130 and is not limited to a particular number of flash memory devices 130. The flash memory devices 130 may each include a single flash memory chip or die. The flash memory devices 130 may be organized among multiple channels through which data is read from and written to the flash memory devices 130 by the controller 120, or coupled to a single channel. The flash memory devices 130 may be implemented using NAND flash memory including 3D NAND memory, where memory cells are stacked into multiple layers, using triple-level cells (TLC) and/or quadruple-level cells (QLC) which can store three and four bits per cell, respectively. For example, the flash memory devices may include NAND flash memory composed of memory cells that can be programmed to store multiple bits or multiple levels, being termed multi-level cells (MLC) such as the aforementioned TLC and/or QLC.

Additionally, the flash memory devices 130 may each include one or more registers for storing operating parameters of the respective flash memory devices 130. In an example, such operating parameters may include: read operation parameters such as read voltages; write operation parameters such as initial pulse value, incremental pulse value, and pulse width; and erase operation parameters such as initial pulse value, incremental pulse value, and pulse width.

As illustrated, the flash memory devices 130 comprise multiple memory cells distributed into storage blocks such as flash memory blocks 140 (e.g., illustrated as flash memory blocks 140(*a*), 140(*b*) to 140(*n*) to depict at least several blocks in respective flash memory devices). The flash memory devices 130 may have one or more flash memory blocks 140, and the flash memory devices 130 may each have the same or different numbers of flash memory blocks 140. The flash memory blocks 140 may be referred to as data blocks or memory blocks and are addressable by the controller 120 using a physical block address. Each of the flash memory blocks 140 is further divided into multiple data segments or pages addressable by the controller 120 using a physical page address or offset from a physical block address of the storage block containing the referenced page. The pages may store sectors or other host data units. The flash memory blocks 140 represent the units of data that are erased within the flash memory devices 130 in a single erase operation. The pages represent the units of data that are read from or written to the flash memory devices 130 in a read or write operation. Although the flash memory devices 130 are described in terms of blocks and pages, other terminology may be used to refer to these data units within a flash storage device.

It is further understood that the subject technology is not limited to any particular capacity of flash memory. For example, storage blocks may each comprise 32, 64, 128, or 512 pages, or any other number of pages. Additionally, pages may each comprise 512 bytes, 2 KB, 4 KB, or 32 KB, for example. The sectors may each comprise, for example, 512 bytes, 4 KB, or other sizes. There may be one or more sectors per page.

In FIG. 1, the memory 125 and the cache 126 represent volatile memory coupled to and used by the controller 120 during operation of the flash storage system 110. The controller 120 may buffer commands and/or data in the memory 125 and/or the cache 126. The controller 120 also may use the memory 125 and/or the cache 126 to store address mapping tables or lookup tables used to convert logical addresses used by the host 150 into virtual and/or physical addresses corresponding to blocks and pages of the flash memory devices 130. Other types of tables, data, status indicators, etc., used to manage the flash memory devices 130 may also be stored in the memory 125 by the controller 120. The memory 125 and/or the cache 126 may be implemented using dynamic random access memory (DRAM), static random access memory (SRAM), or other types of volatile random access memory without departing from the scope of the subject technology. The controller 120 may also periodically store the contents of the memory 125 and/or the cache 126 into one or more designated flash memory blocks 140, such as before the flash storage system 110 is powered down.

The controller 120 manages the flow of data between the host 150 and the flash memory devices 130. The controller 120 is configured to receive commands and data from the host 150 via the interface 115. For example, the controller 120 may receive data and a write command (also referred to as a "programming" or "program" command herein) from the host 150 to write the data in the flash memory devices 130. The controller 120 is further configured to send data to the host 150 via the interface 115. For example, the controller 120 may read data from the flash memory devices 130 and send the data to the host 150 in response to a read command.

The controller 120 is further configured to manage data stored in the flash memory devices 130, the memory 125, and the cache 126 based on internal control algorithms or other types of commands that may be received from the host 150. For example, the controller 120 is configured to perform operations such as garbage collection (GC), error correction coding techniques (e.g., LDPC), wear leveling, security techniques (e.g., encryption), compression techniques, redundancy techniques (e.g., redundant array of independent disks (RAID) techniques), multi-state programming, etc. For example, the controller 120 may use error correction coding to provide protection to data written to the flash memory devices 130. In this regard, the ECC encoder 162 and may encode data received from the host 150. The controller 114 (or component(s) thereof) then writes the encoded data to the one or more of the flash memory devices 130 and/or buffers the encoded data in the memory 125 and/or the cache 126. In a second programming pass or state, the ECC decoder 174 decodes the data from the one or more of the flash memory devices 130 and/or buffered data in the memory 125 and/or the cache 126. The controller 114 (or component(s) thereof) then writes the decoded data to the one or more of the flash memory devices 130 as part of the second programming pass. In one or more implementations, the cache 126 is separate and distinct from the flash memory devices 130, and the cache 126 is not part of the flash memory devices 130.

When the controller 120 (or component(s) thereof) subsequently reads the data from the one or more of the flash memory devices 130, the data is provided by the controller 120 to the host 150 via the interface 115. Those skilled in the art will be familiar with other operations performed by a controller in a flash storage device, which will not be described in detail herein.

The controller 120 may be implemented with a general purpose processor, multi-core processor, micro-controller, digital signal processor (DSP), a system-on-a-chip (SoC), an application specific integrated circuit (ASIC), a field programmable gate array (FPGA) or other programmable logic device, discrete gate or transistor logic device, discrete hardware components, or any combination thereof designed and configured to perform the operations and functions described herein. In the multi-core processor implementation, each of the several computing cores can run respective instructions in parallel including portions of the firmware of the flash storage system 110. The controller 120 may perform the operations and functions described herein by executing one or more sequences of instructions stored on a machine/computer readable medium. The machine/computer readable medium may be the flash memory devices 130, the memory 125, the cache 126 or other types of media from which the controller 120 can read instructions or code. For example, flash storage system 110 may include a read only memory (ROM), such as an EPROM or EEPROM, encoded with firmware/software comprising one or more sequences of instructions read and executed by the controller 120 during the operation of the flash storage system 110.

Figure 2:
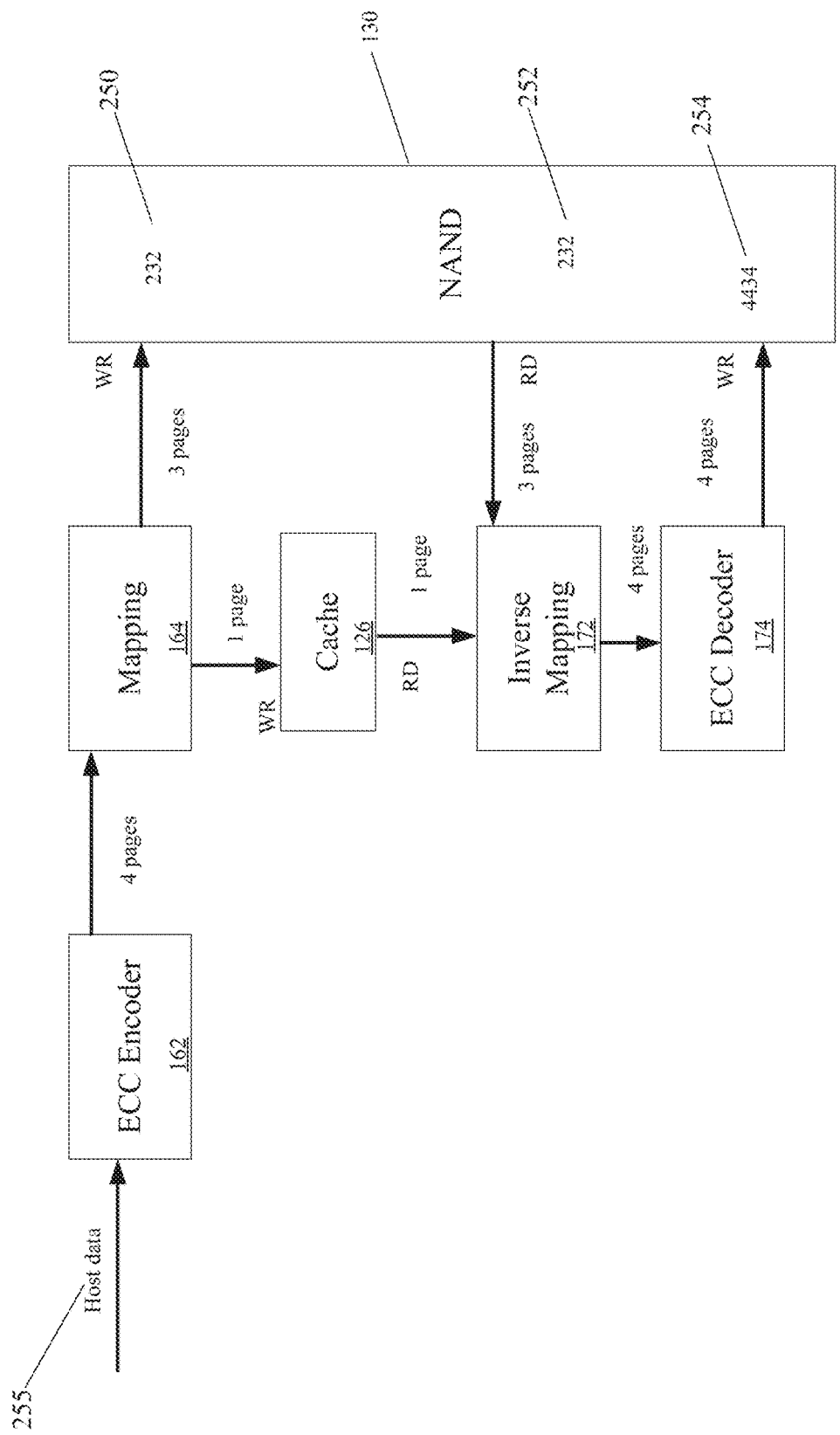
FIG. 2 conceptually illustrates an example of multi-state programming provided by various components of a flash storage system in accordance with one or more implementations of the subject technology.

FIG. 2 conceptually illustrates an example of multi-state programming provided by various components of a flash storage system in accordance with one or more implementations of the subject technology. FIG. 2 is discussed by reference to components of the flash storage system 110 in FIG. 1.

As illustrated, host data 255 from a host device (e.g., the host 150) is received by the ECC encoder 162. In the example of FIG. 2, for programming data into NAND flash memory (one or more of the flash memory devices 130), three pages of data are written, as part of a first programming pass, to flash memory that uses TLC cells, and four pages of data are written, as part of a second programming pass, to flash memory that uses QLC cells (e.g., four bits per cell). Although three and four pages of data are described in this example, the subject technology can write different numbers of pages based on the type of flash memory.

Using an ECC encoding scheme (e.g., Reed-Solomon, BCH, LDPC, etc.), the ECC encoder 162 encodes the host data 255 generating four pages of encoded data. The ECC encoder 162 sends the four pages of encoded data to the mapping component 164. The mapping component 164 receives the four pages of encoded data and performs a mapping operation to convert the encoded data to mapped data in the form of Gray code. Examples of mapping data to Gray code are described in further detail, for example, in FIGS. 3-5 below. The result of the mapping operation generates three pages of data for storing in flash memory and an additional page of data to be stored in a cache. The controller 120 (or alternatively the ECC encoder 162) performs a first programming operation 250 to write the three pages of mapped data to one or more of the flash memory devices 130 (e.g., NAND flash memory) as part of a first programming pass. The controller 120 (or alternatively the mapping component 164) writes the one page of data into a cache (e.g., the cache 126). In an example, the cache 126 is separate from the flash memory devices 130 (e.g., NAND). In another example, the cache 126 is not in the same location as where the first mapped data is written but could be stored in the flash memory devices 130 (e.g., in NAND but at a different location).

The controller 120 (or inverse mapping component 172) performs a read operation for the one page of data stored in the cache 126. The controller 120 (or inverse mapping component 172) performs a second read operation for the three pages of data stored in the flash memory devices 130.

The inverse mapping component 172 performs an inverse mapping operation on the three pages of data based at least in part on the one page of data from the cache 126 to generate four pages of data. The four pages of data correspond to the four pages of data received from the host in an example. An example of inverse mapping of data is discussed in more detail in FIGS. 4 and 5 below. The inverse mapping component 172 sends the four pages of data to the ECC decoder 174 for ECC decoding.

The ECC decoder 174, using an ECC decoding scheme, further decodes the four pages of data in order to eliminate errors from the data and prepare the data for writing to one or more of the flash memory devices 130. As a second pass of programming for writing to TLC memory, the controller 120 (or ECC decoder 174) performs a programming operation 254 to write the ECC decoded four pages of data into one or more of the flash memory devices 130.

Figure 3:
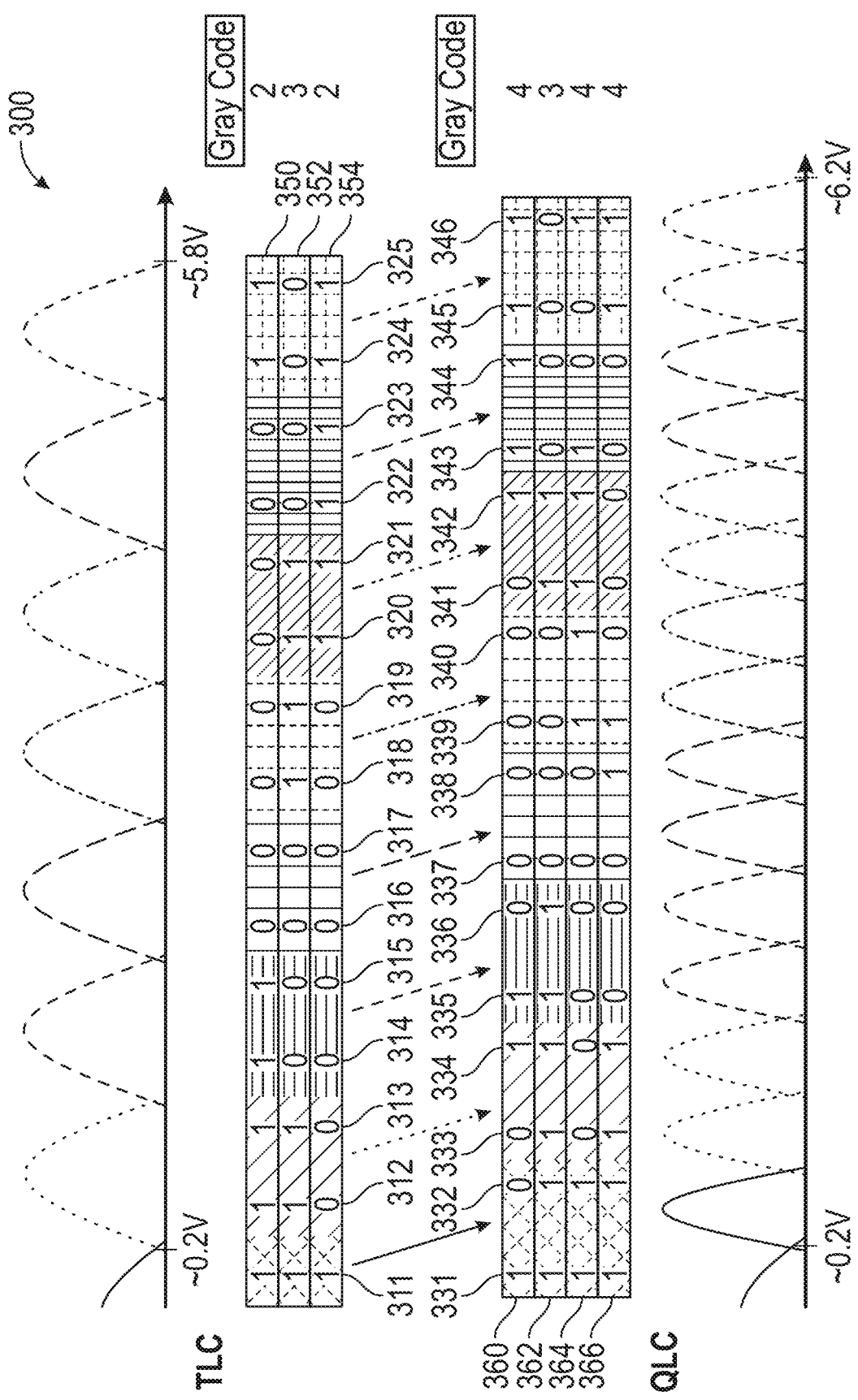
FIG. 3 conceptually illustrates an example of mapping in accordance with one or more implementations of the subject technology.

FIG. 3 conceptually illustrates an example of mapping in accordance with one or more implementations of the subject technology. FIG. 3 is discussed with reference to components of the flash storage system 110 in FIG. 1.

In a first programming pass, three pages of a mapped version of the host data is programmed to standard TLC (232), while one page is stored to a cache (e.g., the cache 126). In a second programming pass, the three TLC pages are read along with the cached page to recover the host data through an inverse mapping operation. The host data are used to extend the already programmed TLC into QLC distributions as shown in FIG. 3.

FIG. 3 illustrate multiple sets of three bits including bits 311, bits 312, bits 313, bits 314, bits 315, bits 316, bits 317, bits 318, bits 319, bits 320, bits 321, bits 322, bits 323, bits 324, and bits 325. These bits may correspond to data that was written, in a first mode for TLC memory, in the flash memory devices 130 as discussed before. As further illustrated the aforementioned sets of three bits may be logically organized into columns 350, 352, and 354, which are discussed in more detail in an example mapping table of FIG. 5. In this example, the flash memory uses TLC memory that can store eight possible states per cell (e.g., values from 000 to 111), yielding three bits of information per cell. Reading data stored in TLC memory therefore can require reading up to seven distributions.

In this example, the flash memory uses a quad-level memory cell (QLC) that can store sixteen possible states per cell (e.g., values from 0000 to 1111), yielding four bits of information per cell. Reading data stored in QLC memory therefore can require reading fifteen distributions.

In an example of using TLC memory, the inverse mapping component 172 reads the three pages of data from the flash memory devices 130 and the one page of data from the cache 126. Using this mapping technique, multiple sets of four bits including bits 311, bits 332, bits 333, bits 334, bits 335, bits 336, bits 337, bits 338, bits 339, bits 340, bits 341, bits 342, bits 343, bits 344, bits 345, and bits 346.

Figure 4:
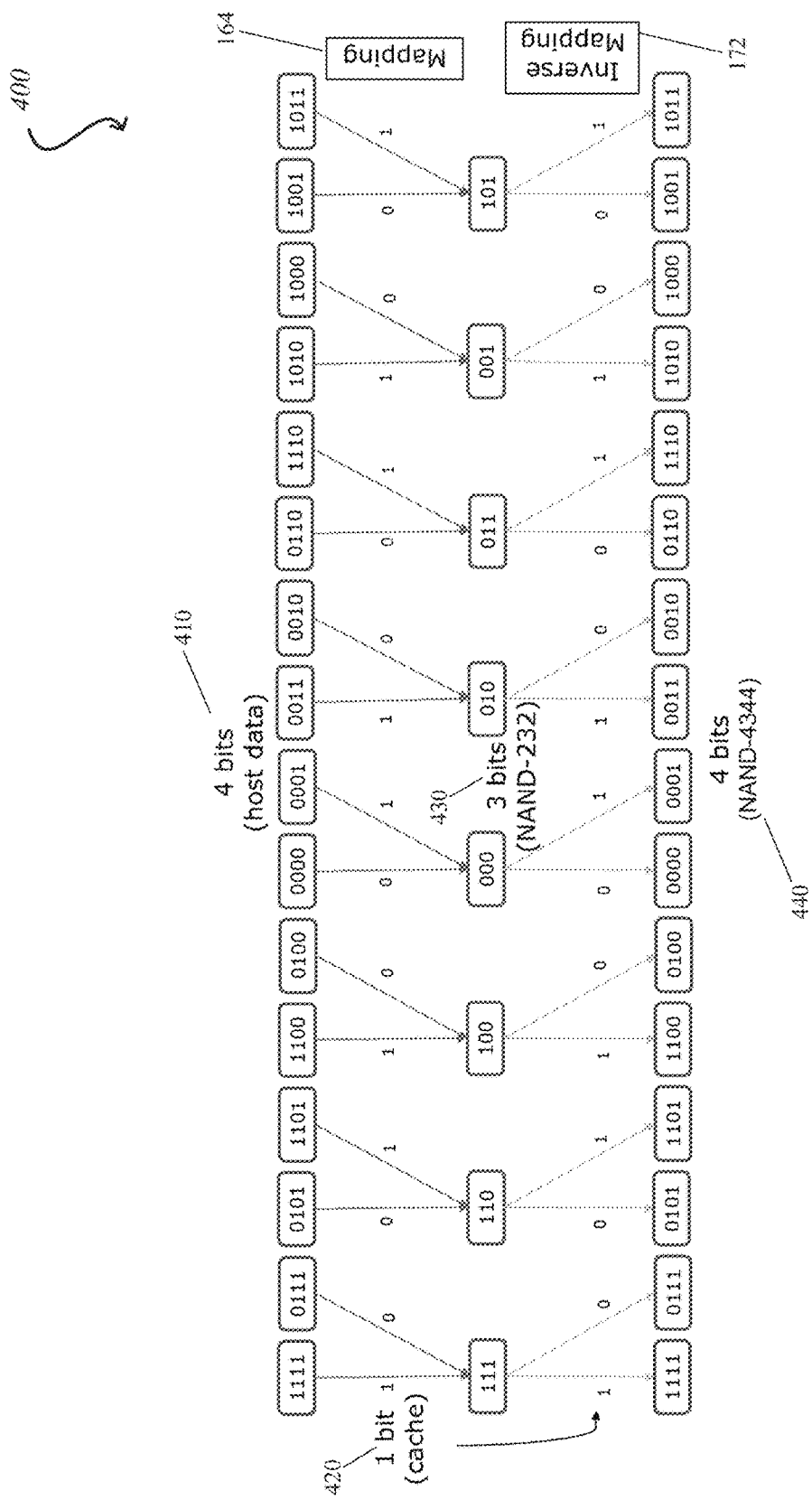
FIG. 4 conceptually illustrates an example of mapping and subsequently performing an inverse mapping in accordance with one or more implementations of the subject technology.

FIG. 4 conceptually illustrates an example of mapping and subsequently performing an inverse mapping in accordance with one or more implementations of the subject technology. FIG. 4 is discussed with reference to components of the flash storage system 110 in FIG. 1.

Implementations of the subject technology advantageously provides mapping of a given TLC Gray code to QLC Gray code that only caches one page of data. For example, the subject technology can also be applied to map MLC to TLC or QLC with one or two cached pages, respectively.

As illustrated, four bits of host data 410 are received by the mapping component 164. The mapping component 164 caches one bit of data from the host data 410 into the cache 126. For each set of four bits of data, the mapping component 164 performs a mapping operation to generate three bits of balanced Gray code 430 (e.g., mapped data) for storing into the flash memory devices 130 in accordance with a 232 balanced Gray code scheme.

As illustrated, the three bits of balanced Gray code 430 are received by the inverse mapping component 172. For each set of the three bits of balanced Gray code 430, the mapping component 164 performs a mapping operation to generate four bits of balanced Gray code 440 for storing into the flash memory devices 130 in accordance with a 4344 balanced Gray code scheme.

Figure 5:
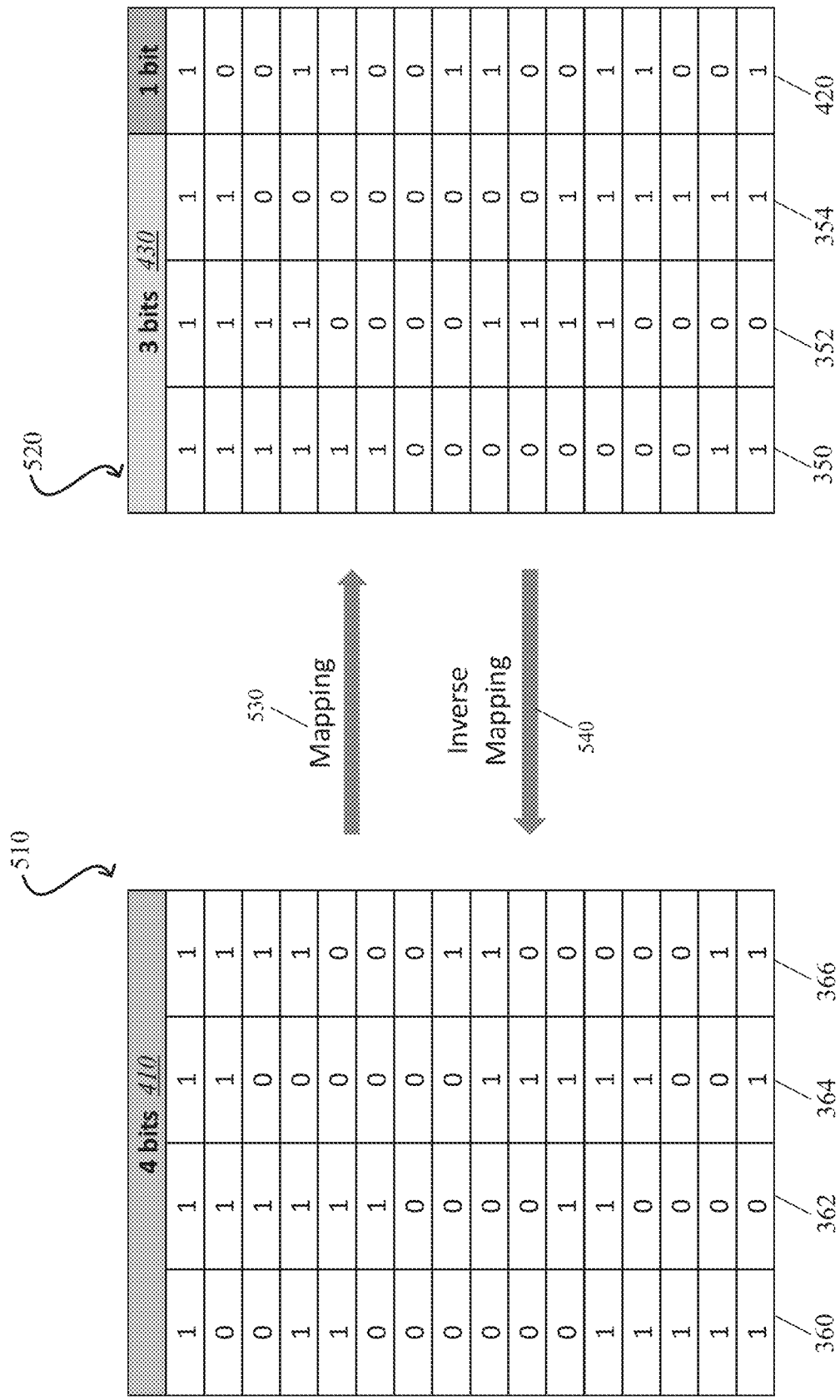
FIG. 5 conceptually illustrates an example data in an initial table and an example mapped data in a second table.

FIG. 5 conceptually illustrates an example data in an initial table and an example mapped data in a second table. The host data table 510, as illustrated, includes representations of data corresponding to the column 360, the column 362, the column 364, and the column 366 in FIG. 3. FIG. 5 is discussed with reference to components of the flash storage system 110 in FIG. 1.

The mapping component 164 performs a mapping operation 530 to generate the three bits of balanced Gray code 430 (e.g., mapped data) for storing into the flash memory devices 130 in accordance with a 232 balanced Gray code scheme. The table 520, as illustrated, includes representations of data corresponding to the column 350, the column 352, and the column 354 in FIG. 3. Further, the table 520 includes a column corresponding to the one page of cached data 420. As can be seen, the column 350 includes two transitions, the column 352 includes three transitions, and the column 354 includes two transitions. The column corresponding to the one page of cached data 420 includes eight transitions. Since the cached data 420 is not stored in TLC flash memory, the cached data 420 can include more transitions than the column 350, the column 352, and the column 354.

The inverse mapping component 172 performs an inverse mapping operation 540 to generate the four bits of balanced Gray code 410 (e.g., inverse mapped data) for storing into the flash memory devices 130 in accordance with a 4344 balanced Gray code scheme. As illustrated, the host data table 510 includes data represented in the 4344 balanced Gray code scheme for the column 360, the column 362, the column 364, and the column 366. For example, the column 360 includes four transitions, the column 362 includes three transitions, the column 364 includes four transitions, and the column 366 includes four transitions.

Figure 6:
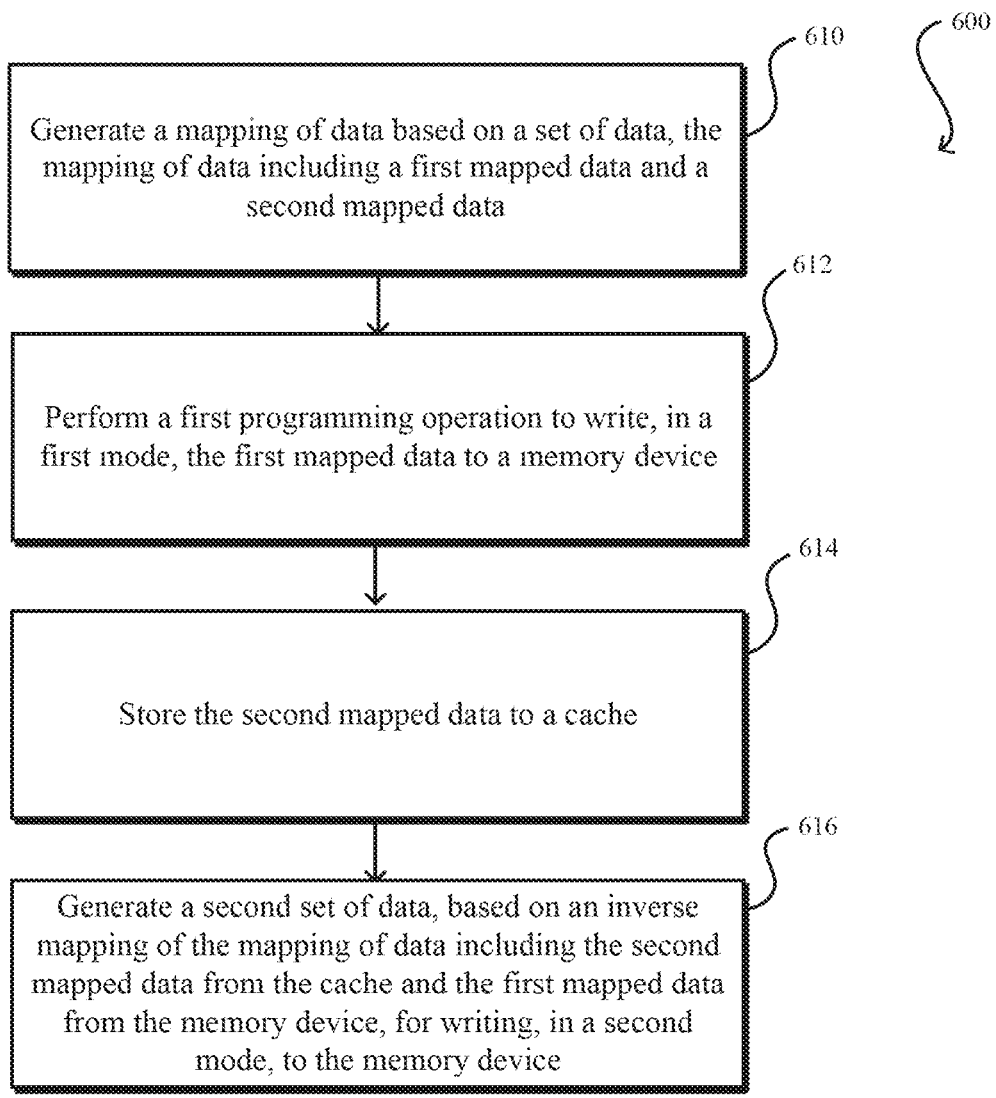
FIG. 6 shows a flowchart of a process for performing multi-state programming in accordance with one or more implementations.

FIG. 6 shows a flowchart of a process 600 for performing multi-state programming in accordance with one or more implementations. Further for explanatory purposes, the blocks of the process 600 are described herein as occurring in serial, or linearly. However, multiple blocks of the process 600 may occur in parallel. In addition, the blocks of the process 600 need not be performed in the order shown and/or one or more blocks of the process 600 need not be performed and/or can be replaced by other operations. One or more blocks of FIG. 6 may be executed by a flash storage system (including, e.g., a controller of a flash memory device, a data storage controller of a data storage system or a solid state storage device (SSD), a processor, or the like). Examples of a flash storage system or a controller may be the flash storage system 110 and/or the controller 120. Similarly, a non-transitory machine-readable medium may include machine-executable instructions thereon that, when executed by a computer or machine, perform the blocks of FIG. 6. The steps of process 600 may be implemented as hardware/firmware or software. FIG. 6 will be described by reference to components of the flash storage system 110.

The process 600 may initiate when host data (e.g., from host 150) is received by the ECC encoder 162. In an example where a given flash memory device uses QLC memory, four pages of data may be received from the host for programming to the flash memory device. The ECC encoder 162 encodes data based on a first encoding operation to generate an encoded set of data. The first encoding operation may be based on an ECC encoding scheme.

At 610, the controller 120 (or mapping component 164) generates a mapping of data based on a set of data, the mapping of data including a first mapped data and a second mapped data. In an example, an amount of the first mapped data is greater than an amount of the second mapped data. In addition, generating the mapping of data based on the set of data may further include: generating the first mapped data and the second mapped data based on a Gray code encoding of the set of data, where the first mapped data includes a first data representable in rows and columns, the first data is represented by balanced Gray codes, and the second mapped data includes a second data. The data in every two rows of the first data are an identical pair. A number of transitions for the first mapped data can include seven transitions, and a number of transitions for the second mapped data includes eight transitions, where each transition corresponds to a change between neighboring data. Further, the first mapped data includes at least a most significant bit (MSB), and the second mapped data includes at least a least significant bit (LSB).

In an implementation, the balanced Gray codes include a sum of transitions for each column, in the first plurality of data, where a total of the sums of the transitions for all of the columns is not greater than a maximum number of read levels for writing in the first mode to the flash memory device. Moreover, a sum of the transitions for one of the columns and a sum of the transitions for a next one of the columns are the same or differ by not more than one. Further, each of the transitions for a column represents a change in values between adjacent rows within the column.

At 612, the controller 120 (or the mapping component 164) performs a first programming operation to write, in a first mode, the first mapped data to the memory device.

At 614, the controller 120 (or the mapping component 164) stores the second mapped data to a cache (e.g., the cache 126).

At 616, the controller 120 (or inverse mapping component 172) generates a second set of data, based on an inverse mapping of the mapping of data including the second mapped data from the cache and the first mapped data from the memory device, for writing, in a second mode, to the memory device, where the second set of data includes the set of data, and the first mode and the second mode correspond to different modes of writing to the memory device. In an implementation, generating the second set of data includes performing a first read operation on the second mapped data from the cache, and performing a second read operation on the first mapped data from the memory device. Moreover, generating the second set of data includes performing a first read operation on the second mapped data from the cache, performing a second read operation on the first mapped data from the memory device, and generating the second set of data, represented by a set of balanced Gray codes, based on a combination of the first mapped data and the second mapped data, where the set of balanced Gray codes includes a sum of transitions that is not greater than a maximum number of read levels for writing in the second mode to the memory device.

In addition, the ECC decoder 174 performs a decoding operation, based on the second set of data, to generate a decoded set of data, and performs a second programming operation to write, in the second mode, the decoded set of data to the memory device. In an example, the aforementioned the first mode is related to programming for triple-level cell (TLC) memory, and the second mode is related to programming for quadruple-level cell (QLC) memory.

Various examples of aspects of the disclosure are described below. These are provided as examples, and do not limit the subject technology.

One or more aspects of the subject technology provide methods for providing an improved multi-stage programming with a reduced memory requirement for buffering data. According to some aspects, a method may include generating a mapping of data based on a set of data, the mapping of data including a first mapped data and a second mapped data, wherein an amount of the first mapped data is greater than an amount of the second mapped data. The method may also include performing a first programming operation to write, in a first mode, the first mapped data to the memory device. The method may also include storing the second mapped data to a cache. The method may also include generating a second set of data, based on an inverse mapping of the mapping of data including the second mapped data from the cache and the first mapped data from the memory device, for writing, in a second mode, to the memory device, wherein the second set of data comprises the set of data, and the first mode and the second mode correspond to different modes of writing to the memory device.

In other aspects, a system may include flash memory devices and a controller. The controller may be configured to generate a mapping of data based on a set of data, the mapping of data including a first mapped data and a second mapped data, wherein an amount of the first mapped data is greater than an amount of the second mapped data. The controller may also be configured to perform a first programming operation to write, in a first mode, the first mapped data to at least one of the plurality of flash memory devices. The controller may be configured to store the second mapped data to a cache. The controller may be configured to generate a second set of data, based on an inverse mapping of the mapping of data including the second mapped data from the cache and the first mapped data from the memory device, for writing, in a second mode, to the memory device, wherein the second set of data comprises the set of data, and the first mode and the second mode correspond to different modes of writing to the at least one of the plurality of flash memory devices.

In further aspects, a system may include means for generating a mapping of data based on a set of data, the mapping of data including a first mapped data and a second mapped data, wherein an amount of the first mapped data is greater than an amount of the second mapped data. The system may also include means for performing a first programming operation to write, in a first mode, the first mapped data to a memory device. The system may also include means for storing the second mapped data to a cache. The system may also include means for generating a second set of data, based on an inverse mapping of the mapping of data including the second mapped data from the cache and the first mapped data from the memory device, for writing, in a second mode, to the memory device, wherein the second set of data comprises the set of data, and the first mode and the second mode correspond to different modes of writing to the memory device.

In further aspects, a non-transitory machine-readable medium may include machine-executable instructions thereon that, when executed by a processor, perform a method. The method may include generating a mapping of data based on a set of data, the mapping of data including a first mapped data and a second mapped data, wherein an amount of the first mapped data is greater than an amount of the second mapped data. The method may also include performing a first programming operation to write, in a first mode, the first mapped data to the memory device. The method may also include storing the second mapped data to a cache. The method may also include generating a second set of data, based on an inverse mapping of the mapping of data including the second mapped data from the cache and the first mapped data from the memory device, for writing, in a second mode, to the memory device, wherein the second set of data comprises the set of data, and the first mode and the second mode correspond to different modes of writing to the memory device.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A storage system, comprising:
   a first memory;
   a second memory;
   one or more controllers configured to cause:
   writing, in a first mode, a first mapped data to the first memory;
   storing a second mapped data to the second memory;
   generating a combined set of data, represented by a set of balanced Gray codes, based on a combination of the first mapped data and the second mapped data, wherein the set of balanced Gray codes includes a sum of transitions that is not greater than a maximum number of read levels for writing in a second mode to the first memory; and
   writing to the first memory, in the second mode, data based on the combined set of data.

2. The storage system of claim 1,
   wherein the first mode and the second mode correspond to different modes of writing to the first memory, and
   wherein the one or more controllers are configured to cause generating the combined set of data, based on an inverse mapping of the first mapped data and the second mapped data.

3. The storage system of claim 1,
   wherein the first mapped data and the second mapped data are based on a first set of data;
   wherein an amount of the first mapped data is greater than an amount of the second mapped data, and
   wherein the combined set of data comprises the first set of data.

4. The storage system of claim 1, wherein the one or more controllers are configured to cause:
   generating a mapping of data based on a first set of data, the mapping of data including the first mapped data and the second mapped data,
   wherein generating the mapping of data comprises:
   generating the first mapped data and the second mapped data based on a Gray code encoding of the first set of data, and
   wherein the first mapped data comprises a first plurality of data representable in rows and columns, the first plurality of data is represented by a plurality of balanced Gray codes, and the second mapped data comprises a second plurality of data.

5. The storage system of claim 4, wherein:
   the plurality of balanced Gray codes include a sum of transitions for each column, in the first plurality of data, wherein a total of the sums of the transitions for all of the columns is not greater than a maximum number of read levels for writing in the first mode to the first memory,
   a sum of the transitions for one of the columns and a sum of the transitions for a next one of the columns are same or differ by not more than one, and
   each of the transitions for a column represents a change in values between adjacent rows within the column.

6. The storage system of claim 4, wherein data in every two rows of the first plurality of data are an identical pair.

7. The storage system of claim 1, wherein a number of transitions for the first mapped data comprises seven transitions, wherein a number of transitions for the second mapped data comprises eight transitions, and wherein each transition corresponds to a change between neighboring data.

8. The storage system of claim 1, wherein the first mapped data comprises at least a most significant bit (MSB), and the second mapped data comprises at least a least significant bit (LSB).

9. The storage system of claim 1, wherein the one or more controllers are configured to cause:
   performing a decoding operation to generate the data based on the combined set of data; and
   performing a second programming operation to write, in the second mode, the data based on the combined set of data, to the first memory.

10. The storage system of claim 1, wherein the first mode is related to programming for triple-level cell (TLC) memory, and the second mode is related to programming for quadruple-level cell (QLC) memory.

11. A method implemented using one or more controllers, the method comprising:
    writing, in a first mode, a first mapped data to a first memory;
    storing a second mapped data to a second memory;
    generating a combined set of data, represented by a set of balanced Gray codes, based on a combination of the first mapped data and the second mapped data, wherein the set of balanced Gray codes includes a sum of transitions that is not greater than a maximum number of read levels for writing in a second mode to the first memory; and
    writing to the first memory, in the second mode, data based on the combined set of data.

12. The method of claim 11,
    wherein the first mode and the second mode correspond to different modes of writing to the first memory, and
    wherein the combined set of data is generated, based on an inverse mapping of the first mapped data and the second mapped data.

13. The method of claim 11,
    wherein the first mapped data and the second mapped data are based on a first set of data;
    wherein an amount of the first mapped data is greater than an amount of the second mapped data, and
    wherein the combined set of data comprises the first set of data.

14. The method of claim 11, comprising:
generating a mapping of data based on a first set of data, the mapping of data including the first mapped data and the second mapped data,
wherein generating the mapping of data comprises:
generating the first mapped data and the second mapped data based on a Gray code encoding of the first set of data, and
wherein the first mapped data comprises a first plurality of data representable in rows and columns, the first plurality of data is represented by a plurality of balanced Gray codes, and the second mapped data comprises a second plurality of data.

15. The method of claim 14, wherein:
the plurality of balanced Gray codes include a sum of transitions for each column, in the first plurality of data, wherein a total of the sums of the transitions for all of the columns is not greater than a maximum number of read levels for writing in the first mode to the first memory,
a sum of the transitions for one of the columns and a sum of the transitions for a next one of the columns are same or differ by not more than one, and
each of the transitions for a column represents a change in values between adjacent rows within the column.

16. The method of claim 14, wherein data in every two rows of the first plurality of data are an identical pair.

17. The method of claim 11, wherein a number of transitions for the first mapped data comprises seven transitions, wherein a number of transitions for the second mapped data comprises eight transitions, and wherein each transition corresponds to a change between neighboring data.

18. An apparatus, comprising:
means for writing, in a first mode, a first mapped data to a first memory;
means for storing a second mapped data to a second memory;
means for generating a combined set of data, represented by a set of balanced Gray codes, based on a combination of the first mapped data and the second mapped data, wherein the set of balanced Gray codes includes a sum of transitions that is not greater than a maximum number of read levels for writing in a second mode to the first memory; and
means for writing to the first memory, in the second mode, data based on the combined set of data.

19. The apparatus of claim 18,
wherein the first mode and the second mode correspond to different modes of writing to the first memory, and
wherein the combined set of data is generated, based on an inverse mapping of the first mapped data and the second mapped data.

20. The apparatus of claim 18,
wherein the first mapped data and the second mapped data are based on a first set of data;
wherein an amount of the first mapped data is greater than an amount of the second mapped data, and
wherein the combined set of data comprises the first set of data.

* * * * *